United States Patent [19]

Terayama

[11] 4,054,807

[45] Oct. 18, 1977

[54] QUARTZ OSCILLATOR MOUNTINGS

[75] Inventor: Toshio Terayama, Tokyo, Japan

[73] Assignee: Kabushiki Kaisha Daini Seikosha, Japan

[21] Appl. No.: 579,931

[22] Filed: May 22, 1975

Related U.S. Application Data

[63] Continuation-in-part of Ser. No. 456,311, March 29, 1974, abandoned.

[30] Foreign Application Priority Data

Mar. 29, 1973 Japan ................................ 48-38188
Mar. 29, 1973 Japan ................................ 48-38189

[51] Int. Cl.$^2$ ............................................. H01L 41/04
[52] U.S. Cl. ................................. 310/348; 310/366; 310/368
[58] Field of Search ............... 310/8.2, 8.3, 9.5, 8.6, 310/8.5, 9.6, 9.1, 9.4, 9.8; 58/23 TF, 23 U

[56] References Cited

U.S. PATENT DOCUMENTS

| | | | |
|---|---|---|---|
| 3,297,889 | 1/1967 | Breskend | 310/8.3 X |
| 3,488,530 | 1/1970 | Staudte | 310/8.5 X |
| 3,566,166 | 2/1971 | Borner | 310/8.2 |
| 3,683,213 | 8/1972 | Staudte | 310/9.6 |
| 3,697,766 | 10/1972 | Ganter | 310/8.2 |
| 3,697,789 | 10/1972 | Kato | 310/9.5 |
| 3,766,616 | 10/1973 | Staudte | 310/8.2 X |

*Primary Examiner*—Mark O. Budd
*Attorney, Agent, or Firm*—Robert E. Burns; Emmanuel J. Lobato; Bruce L. Adams

[57] ABSTRACT

A quartz crystal oscillator element including a substrate of quartz crystal having a plurality of oscillatable parallel prongs extending in a longitudinal direction of the substrate. Parallel metallic electrodes are disposed on each of the prongs thereof. The oscillator element is adhered to a supporting pedestal at a portion of the substrate thereof remote from the prongs. In the embodiment of the invention the electrodes comprise beam leads extending from an end of the substrate for receiving electrical connections to the electrodes. The beam leads are electrically connected to lead pins of additional pedestals so that the substrate bear pressure which develops during electrical connections to the beam leads.

4 Claims, 6 Drawing Figures

QUARTZ OSCILLATOR MOUNTINGS

RELATED APPLICATIONS

This application is a continuation-in-part of U.S. Ser. No. 456,311, filed Mar. 29, 1974, now abandoned.

BACKGROUND OF THE INVENTION

The present invention relates to quartz crystal oscillator elements and more particularly to a new and improved quartz crystal oscillator element.

Oscillator elements of various types are known. Generally the known oscillator elements comprise a quartz crystal substrate having a tuning fork configuration with two parallel prongs extending therefrom and have a natural frequency on the order of 32 KHZ. These conventional oscillator elements have electrodes disposed on opposed major surfaces thereof so that great care is required in mounting them and in making external circuit connections to them. During bonding of lead wires to the electrodes the conventional oscillator elements are subject to cracking because of their extreme thinness. Furthermore, the thins conventional oscillator elements have a low impact resistance.

SUMMARY OF THE INVENTION

It is a principal object of the present invention to provide a new and improved quartz crystal oscillator.

Another object is to provide a quartz crystal oscillator having electrodes that can have connections made thereto without subjecting the quartz crystal substrate to pressure.

Still another object is to provide a quartz crystal oscillator easily mounted for high impact resistance.

An oscillator according to the invention comprises a quartz crystal substrate having a pair of opposed major surfaces and a plurality of oscillatable parallel prongs extending in a longitudinal direction therefrom. Metallic electrodes are disposed on one or both of the opposed major surfaces and extend in a longitudinal direction of the substrate. Metallic masses separate from the electrodes are disposed at free ends of the prongs. Support means support the oscillator at a portion thereof remote from the prongs and the oscillator is secured by means adhering the oscillator to the support means.

According to the invention at least one of the electrode comprises an extension i.e. beam leads thereof extending laterally from an end of said substrate in a longitudinal direction opposite to the parallel prongs.

The beam leads are electrically connected to lead pins of additional pedestals by means of weldering or soldering etc.

The means adhering the oscillator to the support means may be an adhesive so that the oscillator is rigidly supported. Other embodiments of the invention include resilient means adhering the oscillator to the support means thereby providing protection from mechanical shocks to the oscillator.

In another embodiment the oscillator comprises a quartz crystal substrate having a pair of opposed major surfaces and three oscillatable parallel prongs. A plurality of parallel electrodes are disposed on one of the major surfaces of the substrate and the element is adhered to support means at a portion of the major surface of the substrate opposite the major surface carrying the electrodes and remote from the prongs.

BRIEF DESCRIPTION OF THE DRAWINGS

Other features and advantages of the oscillator element according to the invention will be apparent from the disclosure and appended claims and drawings in which:

FIG. 1b is a bottom plan view of the oscillator element shown in FIG. 1a;

DESCRIPTION OF THE PREFERRED EMBODIMENT

Figure 1A:
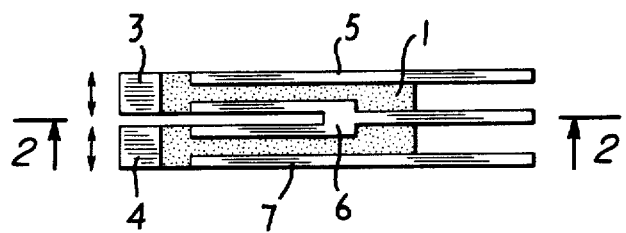
FIG. 1a is a top plan view of an oscillator according to the present invention.
Figure 1B:
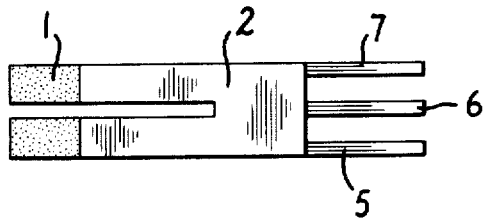

The oscillator element according to the present invention comprises a quartz crystal substrate 1 having electrodes 5, 6 and 7 disposed on an upper major surface thereof and an electrode 2 disposed on a lower major surface. The electrodes 2, 5, 6, and 7 compise integral beam leads extending outwardly in a common direction from an end of the quartz crystal substrate 1. As shown in FIGS. 1a and 1b, the substrate 1 is U-shaped or shaped like a tuning fork. Electrode 5 is disposed along a lateral edge of one of the prongs of substrate 1 and electrode 7 is disposed along an opposed lateral edge of the other prong while electrode 6 is disposed along the adjacent lateral edges of each of the prongs. Additional masses 3 and 4 are disposed on the major surface of the substrate 1 carrying the electrodes 5, 6 and 7 at portions of the prongs remote from the electrodes. The additional masses 3 and 4 are selected to establish the natural frequency of oscillation of the oscillator element at a desired frequency.

Figure 2:
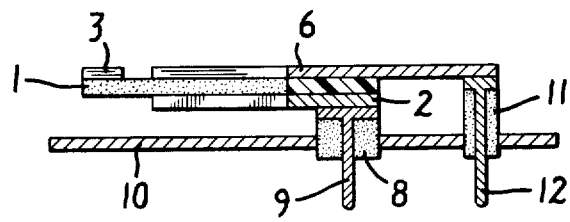
FIG. 2 is a cross-sectional view showing the state where the oscillator element is mounted on a supporting pedestal and beam leads are connected to external terminals.

FIG. 2 illustrates the oscillator element shown in FIGS. 1a and 1b mounted on a supporting pedestal 8 having a lead pin 9 by conductive adhesive agent. The beam lead ends of the electrodes extending from the oscillator element are connected to additional pedestal 11 (other two pedestals are not shown) having lead pins 12 by means of weldering or soldering etc.

The supporting pedestal 8 and additional pedestals 11 are made of electrically insulating material and are fixed on a bottom 10 of a case. The lead pins 9 and 12 made of electrical conductor connect the oscillator to an external electronic circuit.

Since no pressure is added to the substrate during electrical connection of beam leads, the substrate is kept from the damage.

Figure 3:
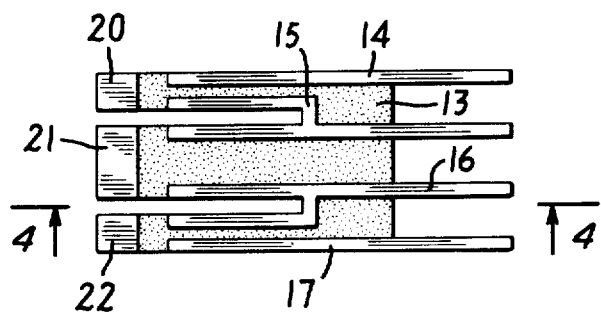
FIG. 3 is a top view of the oscillator element having three oscillatable parallel prongs.
Figure 4:
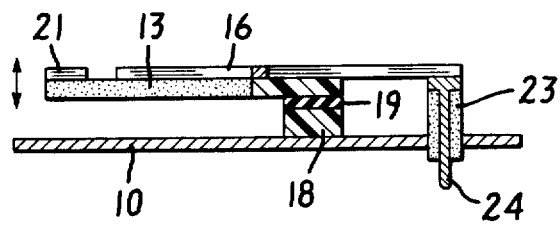
FIG. 4 is a cross-sectional view showing the state where the oscillator element of FIG. 3 is mounted on a supporting pedestal and beam leads are connected to external terminals.

The oscillator element shown in FIG. 3 comprises a quartz crystal substrate 13 having a three-pronged tuning fork configuration with electrodes 14–17 disposed on a major surface thereof. In this embodiment of the invention there are no electrodes disposed on the major surface of the substrate 13 opposite the surface carrying the electrodes 14–17. Consequently this embodiment of the invention may be mounted on a supporting pedestal 18 with a resilient member 19 between the supporting pedestal 18 and the substrate 13, as shown in FIG. 4 with no consideration given to the conductivity of the supporting pedestal 18 or the resilient member 19. The supporting pedestal 18 is adhered to the bottom 10 of a case by adhesive. Additional masses 20, 21 and 22 are disposed on the major surface of the substrate carrying the electrodes 14–17 at end portions of the three prongs remote from the electrodes.

Each of the electrodes 14–17 has beam lead extending from the oscillator element 13. Each beam lead is soldered respectively on an additional pedestal 23 (other pedestals are not shown) having a lead pin 24.

Figure 5:
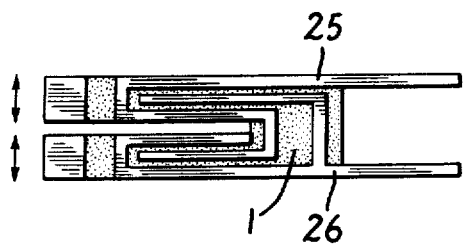
FIG. 5 is a top view of another embodiment according to the invention.

FIG. 5 shows another embodiment of the invention. It has only two electrodes 25, 26 on an upper surface and has no electrode on an opposite surface of the substrate. This oscillator element is mounted in a same way as shown in other embodiment. The difference is the configuration of electrodes which increase oscillating efficiency.

The prongs of each oscillator element oscillate to the direction shown by arrows.

The substrate 1 and 13 may be formed from a thin quartz crystal wafer by a photo-etching process and the electrodes and the additional masses may also be formed from metallic layers disposed on a major surface of the substrate by a photo-etching technique. Furthermore, the oscillator element may be made from a piezoelectric material or another electrostrictive material such as barium titanate, lithium tantalate or lead zirconate.

The quartz crystal oscillator element according to the present invention is well suited for use as a mechanical filter or an oscillator frequency source in portable electronic devices because the device may be elastically supported thereby rendering it shock-resistant. Moreover, the oscillator element according to the present invention may have beam leads soldered thereto without breaking or cracking the oscillator element resulting in simplification of electrical connection and process a high yield of useable devices.

What I claim and desire to secure by Letters Patent is:

1. The combination comprising: an oscillator element comprising an elongated substrate having a pair of opposed major surfaces and a plurality of oscillatable parallel prongs extending in a longitudinal direction therefrom, and a plurality of metallic electrodes on at least one of said major surfaces, at least one of said metallic electrodes including a unitary beam lead portion extending away from and beyond said substrate in a longitudinal direction therefrom generally parallel to said at least one major surface on which said at least one metallic electrode is disposed and away from said plurality of prongs, said beam lead portions having a remote end remote from said substrate; a base; a first pedestal mounted on said base for supporting said substrate; means securing said oscillator element to said first pedestal, said oscillator element being supported by said first pedestal at an end portion of said substrate remote from said plurality of prongs whereby said plurality of prongs remain free to oscillate, and said substrate being disposed with one of its major surfaces secured to said first pedestal by said means securing said oscillator element; and a second pedestal mounted on said base and positioned beneath the remote end of said beam lead portion of said at least one metallic electrode, said second pedestal having a height extending from said base to the remote end of said beam lead portion for supporting the same and for bearing loads developed when connection is made with said beam lead portion.

2. The combination according to claim 1, further comprising: a resilient pad disposed between said first pedestal and said substrate for protecting said oscillator element against mechanical shocks.

3. The combination according to claim 1: wherein at least one of said electrodes is disposed on the major surface of said substrate which is secured to said first pedestal; wherein said first pedestal is electrically insulative and includes a conductive pin extending therethrough and contacting said at least one electrode disposed on the major surface secured to said first pedestal; and wherein said securing means comprises a conductive adhesive for electrically connecting said at least one electrode with said conductive pin extending through said first pedestal, whereby said conductive pin comprises a terminal for said at least one electrode.

4. The combination according to claim 1: wherein said second terminal is electrically insulative and includes a conductive pin extending therethrough and contacting said beam lead portion and making electrical connection therewith, whereby said conductive pin comprises a terminal for said beam lead portion.

* * * * *